(12) United States Patent
Im (10) Patent No.: US 7,580,322 B2
(45) Date of Patent: Aug. 25, 2009

(54) HIGH SPEED PROGRAMMING FOR NONVOLATILE MEMORY

(75) Inventor: Jae-Woo Im, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 206 days.

(21) Appl. No.: 11/249,095

(22) Filed: Oct. 11, 2005

(65) Prior Publication Data
US 2006/0077720 A1 Apr. 13, 2006

(30) Foreign Application Priority Data
Oct. 12, 2004 (KR) .................. 10-2004-0081465

(51) Int. Cl.
*G11C 8/00* (2006.01)
(52) U.S. Cl. ............. 365/236; 365/185.28; 365/185.33; 365/185.23; 365/239; 365/238.5; 365/230.06
(58) Field of Classification Search ............ 365/185.28, 365/185.33, 185.23, 230.06, 239, 236, 238.5
See application file for complete search history.

(56) References Cited

U.S. PATENT DOCUMENTS

| | | | | |
|---|---|---|---|---|
| 5,430,674 A | * | 7/1995 | Javanifard | 365/185.1 |
| 5,646,890 A | * | 7/1997 | Lee et al. | 365/185.11 |
| 5,768,193 A | * | 6/1998 | Lee et al. | 365/185.25 |
| 5,991,196 A | * | 11/1999 | Thomsen et al. | 365/185.11 |
| 6,058,042 A | | 5/2000 | Nobukata | |
| 6,259,628 B1 | * | 7/2001 | Park | 365/185.22 |
| 6,266,270 B1 | | 7/2001 | Nobukata | |
| 6,362,990 B1 | * | 3/2002 | Gibson et al. | 365/49.1 |
| 6,717,862 B2 | * | 4/2004 | Naso et al. | 365/185.33 |
| 6,839,818 B2 | * | 1/2005 | Gastaldi et al. | 711/156 |
| 6,882,583 B2 | * | 4/2005 | Gorman et al. | 365/200 |
| 7,161,839 B2 | * | 1/2007 | Im | 365/185.28 |
| 7,266,029 B2 | * | 9/2007 | Jeong | 365/207 |

FOREIGN PATENT DOCUMENTS

| | | |
|---|---|---|
| JP | 2002-109894 | 4/2002 |
| KR | 2002-0047770 | 6/2002 |

OTHER PUBLICATIONS

English language abstract of Korean Publication No. 2002-0047770.
English language abstract of Japanese Publication No. 2002-109894.

* cited by examiner

*Primary Examiner*—Pho M. Luu
*Assistant Examiner*—Eric Wendler
(74) *Attorney, Agent, or Firm*—Marger Johnson & McCollom, P.C.

(57) ABSTRACT

A nonvolatile memory device is programmed by selectively scanning input data bits to detect data bits to be programmed, and programming the detected data bits. The detected data bits may be programmed in predetermined units. The input data bits may be selectively scanned by combining input data bits in groups, thereby generating combinational information, and generating address information in response to the combinational information.

24 Claims, 12 Drawing Sheets

HIGH SPEED PROGRAMMING FOR NONVOLATILE MEMORY

CROSS-REFERENCE TO RELATED APPLICATIONS

This U.S. non-provisional patent application claims priority under 35 U.S.C. § 119 of Korean Patent Application 2004-81465 filed on Oct. 12, 2004, the entire contents of which are hereby incorporated by reference.

BACKGROUND

Nonvolatile memory devices retain their data stored in memory cells even without a power supply. Flash memory is a type of nonvolatile memory device this is widely used in computers, memory cards, and so forth, because of its ability to program and erase individual memory cells.

Flash memories are generally classified into NOR and NAND types. A NOR flash memory has a memory cell array in which more two cell transistors are connected to in parallel to a bitline. Data is stored by means of channel hot electron effects and erased means of the Fowler-Nordheim (F-N) tunneling effect. A NAND flash memory has a memory cell array in which more than two cell transistors are connected in series with a bitline. Data in a NAND flash memory is both stored and erased by means of the F-N tunneling effect. In general, NOR flash memory is capable of high frequency operation, but its high power consumption is disadvantageous when used in highly integrated devices. NAND flash memory, on the other hand, is advantageous for high integration levels because it consumes low levels of cell current.

The memory cell array of a NOR flash memory is composed of banks, each bank having multiple sectors. Each sector, in turn, includes multiple memory cells. In a NOR flash memory, cells are erased in entire sectors and programmed in words (or bytes).

In programming data into a NOR flash memory, a program command is first applied to the memory device, followed by program addresses and data. The program addresses and data are temporarily stored in the memory device, as well as a memory cell assigned to the program address. A program voltage corresponding to the program data is applied to the bitline, and then an actual programming operation is carried out. After an initial program execution time, verification operation is performed to determine whether the selected memory cell has been successfully programmed. Such programming and verification operations are repeated until the selected memory cell is completely programmed.

In a usual method for programming NOR flash memory by channel hot electron injection, a high voltage of about 4~6V is applied to the drain of the memory cell. Applying this high voltage to the cell requires a relatively high program current over a predetermined level. Since the high voltage applied to the drain is generated by a charge pump embedded in the NOR flash memory chip, the number of memory cells that can be programmed at the same time is generally restricted two or four due to the limited generation capacity of the charge pump. This limited program capacity results in increased programming times. For example, if a 16-bit word of data must be programmed, but the maximum simultaneous program capacity of the embedded charge pump is 4 bits, the word must be divided into 4 groups of 4 bits, and the programming operation must be repeated four times.

Prior to programming data into a flash memory, the memory array, or some portion thereof, is erased by setting all memory cells to a logic '1'. Thus, to program data into a flash memory, only those cells that are to be changed to logic '0' actually need to be programmed. However, most flash memories are designed to spend the same amount programming each cell regardless of the value of data being programmed.

SUMMARY

In one exemplary embodiment according to the inventive principles of this patent disclosure, a method of programming a nonvolatile memory device may include selectively scanning input data bits to detect data bits to be programmed, and programming the detected data bits. The detected data bits may be programmed in predetermined units. Selectively scanning input data bits may include combining input data bits in groups, thereby generating combinational information, and generating address information in response to the combinational information.

In another exemplary embodiment according to the inventive principles of this patent disclosure, a nonvolatile memory device may include a data scanning unit to selectively scan input data bits, thereby identifying detected data bits to be programmed, and a write driver to program the detected data bits. The data scanning unit may include combinational logic to generate combinational signals by combining input data bits, and an address generator to generate addresses in response to the combinational signals.

DETAILED DESCRIPTION

Preferred embodiments in accordance with the inventive principles of this patent disclosure will be described below in more detail with reference to the accompanying drawings. The inventive principles may, however, be embodied in different forms and should not be construed as limited to the embodiments set forth herein. Rather, these embodiments are provided as instructive examples to those skilled in the art.

In advance nonvolatile memory devices, input data bits are combined into groups that are scanned to detect data bits that actually need to be programmed. Addresses for the detected data bits are generated, generally through a counting operation, to allow for selective programming of the detected bits.

Such a technique is referred to as a "bit scanning program scheme".

In accordance with the inventive principles of this patent disclosure, a programming operation may be carried out for a unit having a predetermined number of bits that are actually to be programmed. Moreover, the input data may be selectively scanned in accordance with data bit combinations, instead of scanning all data bits. This may minimize data scanning time and effectively reduce the average time for programming data.

In programming data into a nonvolatile memory device such as a flash memory, the address to be programmed is first erased (set to a logic value of '1') prior to beginning the programming process. Programming data changes the value of certain cells from '1' to '0'. Thus, bits that are to be programmed to '1' do not actually need to be programmed. In accordance with the inventive principles of this patent disclosure, a programming operation is only performed on memory cells that are to be changed to '0' (i.e., data bits that are to be actually programmed) to effectively reduce the programming time. Moreover, to further shorten the time consumed during programming, input data may be selectively scanned according to the inventive principles of this patent disclosure.

Figure 1:
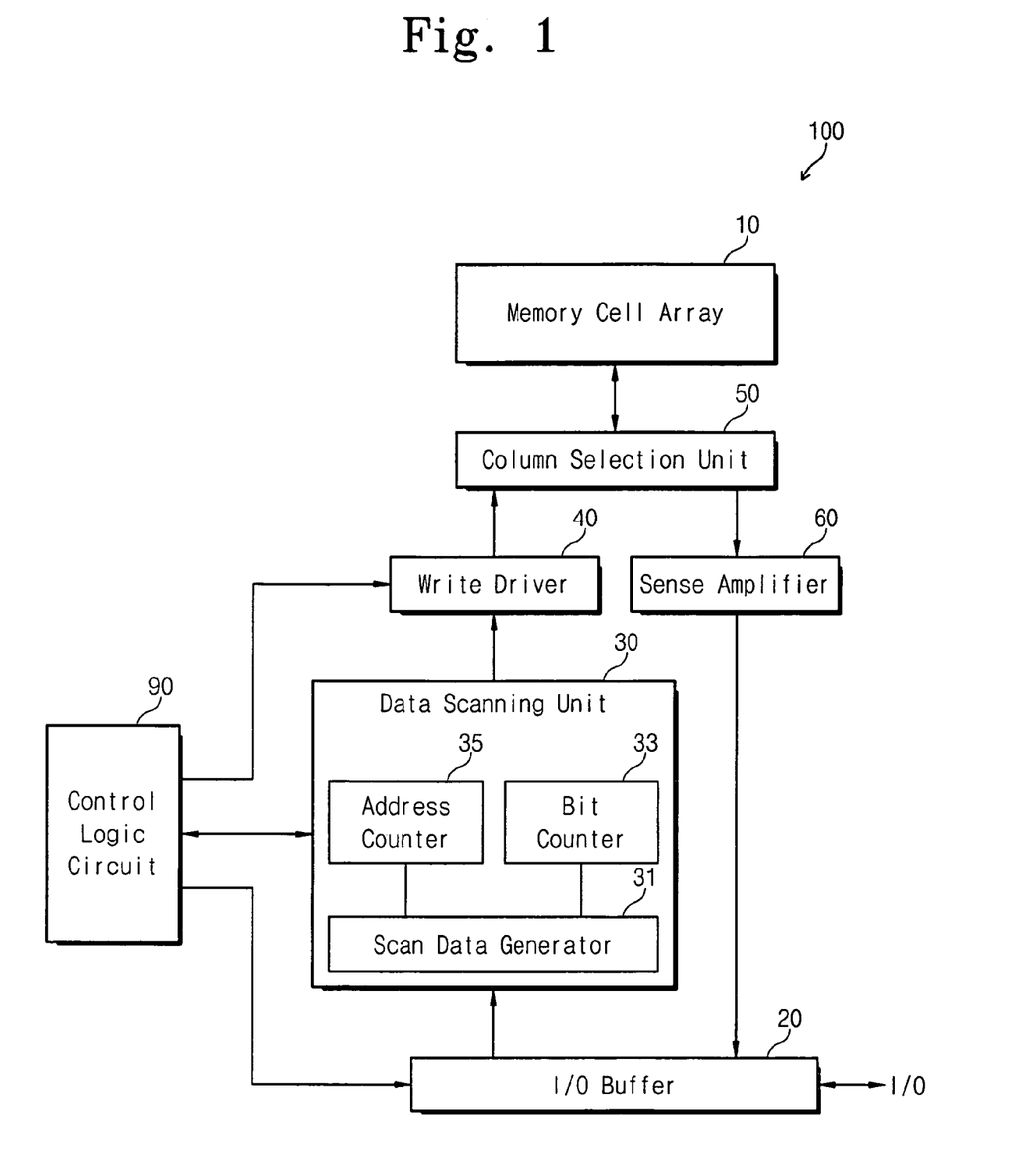
FIG. 1 is a block diagram of an embodiment of a nonvolatile semiconductor memory device in accordance with the inventive principles of this patent disclosure.

FIG. 1 is a block diagram of a preferred embodiment of a nonvolatile semiconductor memory device 100 in accordance with the inventive principles of this patent disclosure.

A semiconductor memory device is generally comprised of a cell array region having memory cells, and a peripheral circuit region having circuitry for selecting rows and columns in the cell array region. If the cell array region is segmented into array blocks, peripheral circuitry includes multiple circuits corresponding to the multiple array blocks. The array and peripheral regions described below may be one among many array blocks and associated peripheral circuitry, or it may be the only such regions for a particular device. The device 100 illustrated in FIG. 1 is shown for a NOR flash memory, but a parallel bit scanning program technique according to the inventive principles of this patent disclosure may be also applicable to other nonvolatile memories.

Referring to FIG. 1, the memory device 100 includes a memory cell array 10, an input/output buffer 20, a data scanning unit 30, a write driver 40, a column selection unit 50, a sense amplifier 60, and a control logic circuit 90.

The memory cell array 10 is composed of NOR flash memory cells. The input/output buffer 20 stores data sensed from the memory cell array 10. The data scanning unit 30 logically combines data provided from the input/output buffer 20 and then performs a data scanning operation in accordance with the result of the data combination. The data scanning unit 30 scans for '0' data bits and counts the number of '0' data bits found. When the number of '0' bits counted reaches a programmable bit number BitMax, the data scanning unit 30 transfers the found data bit and address information to the write driver 40 in response to the control logic circuit 90. The simultaneously programmable bit number BitMax represents the maximum number of bits programmable by the write driver 40 at one time. While BitMax may be variable depending on circuit construction, as an illustrative example, this embodiment is arranged to be operate with a BitMax value of 4 bits.

The data scanning unit 30 includes a scan data generator 31, a bit counter 33, and an address counter 35. The scan data generator 31 controls the operation of the data scanning unit 30 and includes signal combination circuits, 311, 312, 314, and 318, which generate scanning data group signals, Scan-Data1, ScanData2, ScanData4, and ScanData8 by logically combining data bits input from the input/output buffer 20.

The scanning data group signals ScanData1~ScanData8 from the scan data generator 31 are applied to the address counter 35.

The bit counter 33 finds data bits that actually need to be programmed (i.e., '0' data bits) in response to the scanning data group signals ScanData1~ScanData8 from the scan data generator 31 and then counts the number of '0' data bits. These counting operations by the bit counter 33 and the address counter 35 are carried out under the control of the control logic unit 90.

The operation to find the data bits to be programmed (i.e., data bits of '0') in the bit counter 33 is conducted on the basis of input data bits supplied from the input/output buffer 20. However, this embodiment performs a selective scanning operation in response to values of the scanning data group signals ScanData1~ScanData8, rather than performing a sequential scanning operation on all input data bits. If it determines that there are no '0' data bits, the scanning operation is omitted since it is not necessary. As a result, the time required for scanning and programming may be reduced.

The write driver 40 provides the cell array 10 with the scanning result (i.e., number and addresses of '0' data bits) from the data scanning unit 30. The number of bits programmed is equal to the value of BitMax. The write driver 40 includes a latch (not shown) to store data received from the input/output buffer 20. The write driver 40 programs data bits that actually need to be programmed (i.e., data bits having a value of '0'), rather than programming all data. Input data bits having a value of '1' are not programmed because the erased state is already '1'. The column selector 50 designates bitlines in the cell array 10 that are to be programmed from the write driver 40 (i.e., bitlines corresponding to address information generated by the data scanning unit 30).

After writing (or programming) data into the memory cell array 10, the data is read back by the sense amplifier 60. The data from the sense amplifier 60 is stored with corresponding address in the input/output buffer 20 and thereafter read out of the memory device. As well known by those skilled in the art, the data output from the sense amplifier 60 is used for verifying whether the program has been successful (pass or fail) by means of a program verification circuit (not shown). If it determines that data has been improperly programmed (i.e., fail), the corresponding data is programmed again. Embodiments of bit scanning programming methods according to the inventive principles of the patent disclosure are also applicable to re-programming operations, as well as initial programming operations.

As described above, the embodiment of a memory device 100 according to the inventive principles of this patent disclosure performs a selective scanning operation for data in response to combinations of input data bits, rather than indiscriminately data bits to identify input data bits that actually need to be programmed. As a result, it may reduce data scanning and programming times.

Figure 2:
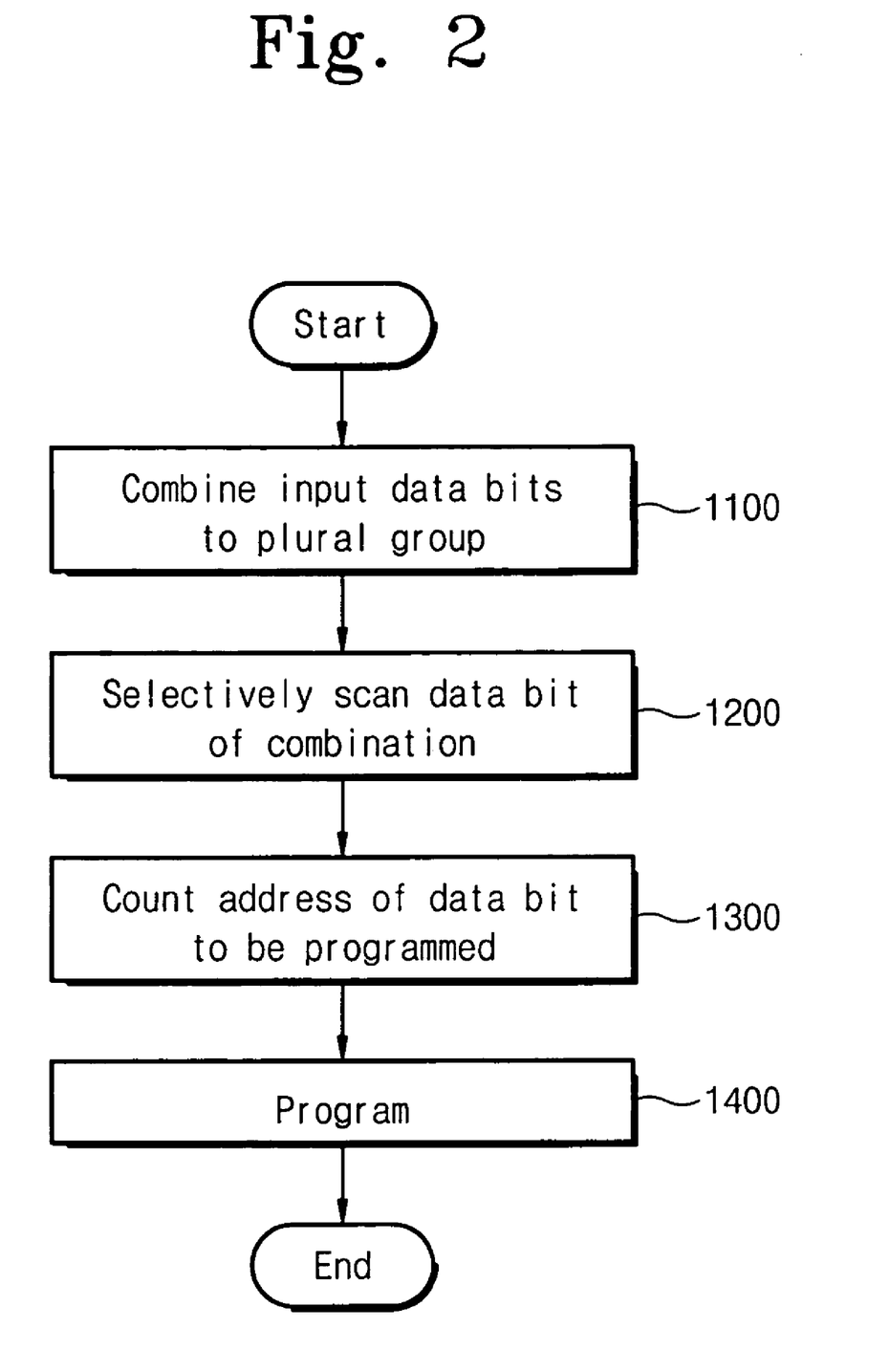
FIG. 2 is a flow chart showing an embodiment of a program method in accordance with the inventive principles of this patent disclosure.
Figure 3:
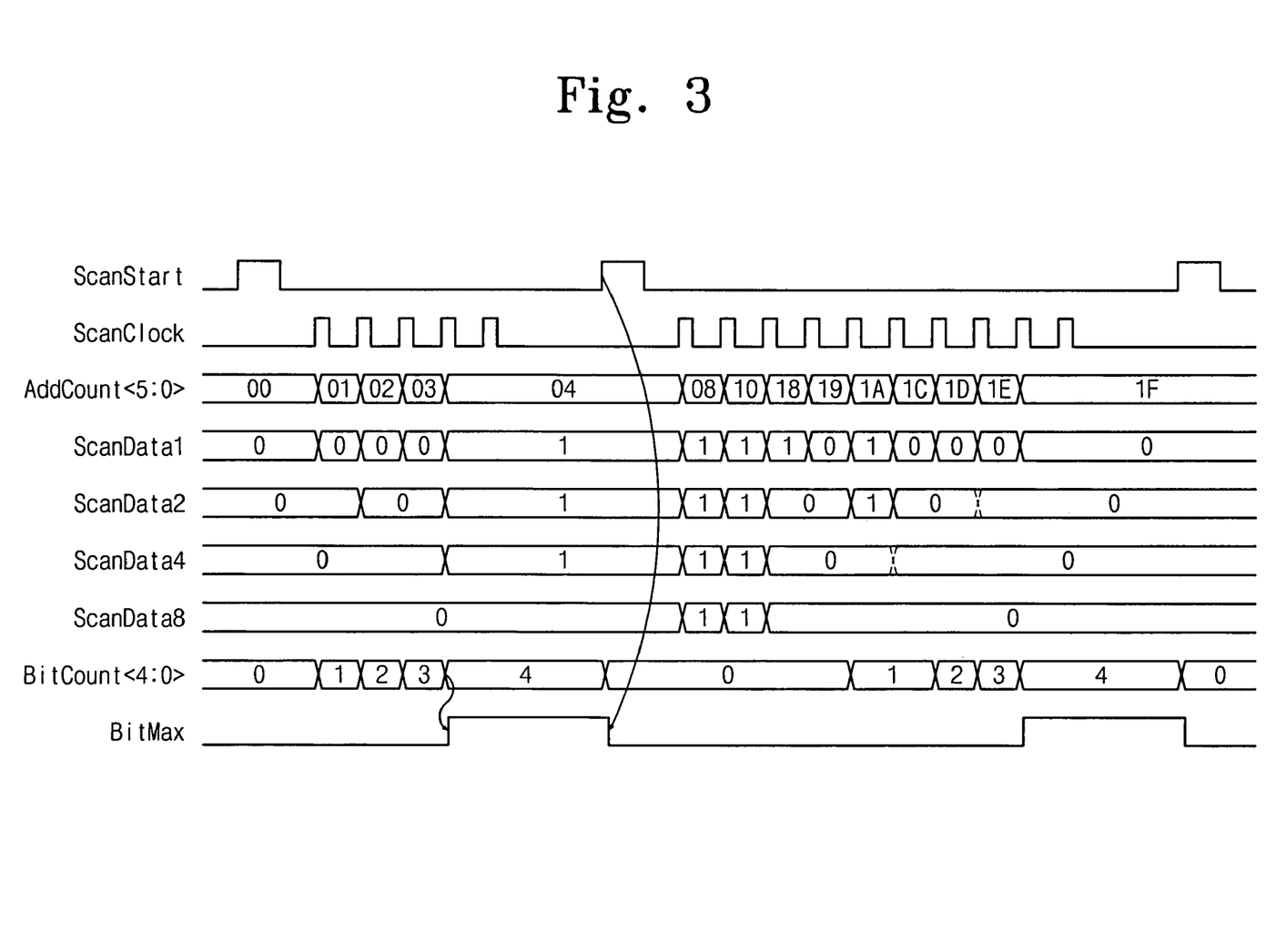
FIG. 3 is a timing diagram showing an embodiment of a procedure according to the inventive principles of this patent disclosure.

FIG. 2 is a flow chart showing an embodiment of a program method in accordance with the inventive principles of this patent disclosure. FIG. 3 is a timing diagram illustrating the operation of an embodiment of a program procedure in accordance with the inventive principles of this patent disclosure.

Referring to FIGS. 2 and 3, scanning data group signal are established by logically combining input data bits (step 1100). At step 1100, the scan data generator 31 logically combines data bits supplied from the input/output buffer 20. The scan data generator 31 outputs M scanning data group signals (where M is a positive integer), ScanData1, Scan-Data2, ScanData4, ScanData8, . . . , and ScanData$2^{M-1}$, as results of the logical combinations. Each scanning data group is generated by logically combining $2^N$ input data bits (where N is a positive integer). An embodiment of a procedure for generating each scanning data group will be described in more detail with reference to FIGS. 4A through 4D.

After generating the M scanning data group signals ScanData1~ScanData$2^{M-1}$, by logically combining the data bits at step 1100, selective scanning operations are performed on the data bits in compliance with the scanning data group signals (step 1200).

In this example, the generation of four scanning data group signals (M=4) ScanData1~ScanData8, will be described as illustrated in FIG. 3. The inventive principles, however, are not limited to a particular number of scanning data group signals. If at least one of the four scanning data group signals is '1', a scanning operation for the corresponding data bits is not carried out. If, however, the four scanning data group signals are all '0' at the current scanning position, the embodiment determines that there is a bit to be actually programmed and increments BitCount by 1. A bit counting operation by the bit counter 33 will be described with reference to FIG. 5 below.

If a data bit to be programmed is detected at step 1200, the address counter 35 calculates the address of the detected data bit in response to the M scanning data group signals ScanData1, ScanData2, ScanData4, and ScanData8 (step 1300). The operation and circuit structure of an embodiment of the address counter 35 will be described in conjunction with FIGS. 6 and 7 below.

After calculating the data bits to be programmed and addresses thereof at steps 1200 and 1300, the data bits are programmed in a unit determined by the programmable bit number BitMax (step 1400). During step 1400, the bit counter 33 is reset to '0' after performing a counting operation until BitCount reaches BitMax as a result of the counting operation. The bit counter 33 maintains the reset value while performing the programming operation on a number of bits determined by BitMax and then performs scanning and counting operations for the remaining data bits in response to a scanning start signal ScanStart. With this procedure, the reduction in programming time may be more pronounced as the number of data bit to be programmed increases.

FIGS. 4A through 4D illustrate embodiments of signal combination circuits in accordance with the inventive principles of this patent disclosure suitable for use in the scan data generator shown in FIG. 1. FIGS. 4A, 4B, 4C, and 4D show a first signal combination circuit 311 that generates the first scanning data group signal ScanData1, a second signal combination circuit 312 that generates the second scanning data group signal ScanData2, a third signal combination circuit 314 that generates the third scanning data group signal ScanData3, and a fourth signal combination circuit 318 that generates the fourth scanning data group signal ScanData4, respectively.

Figure 4A:
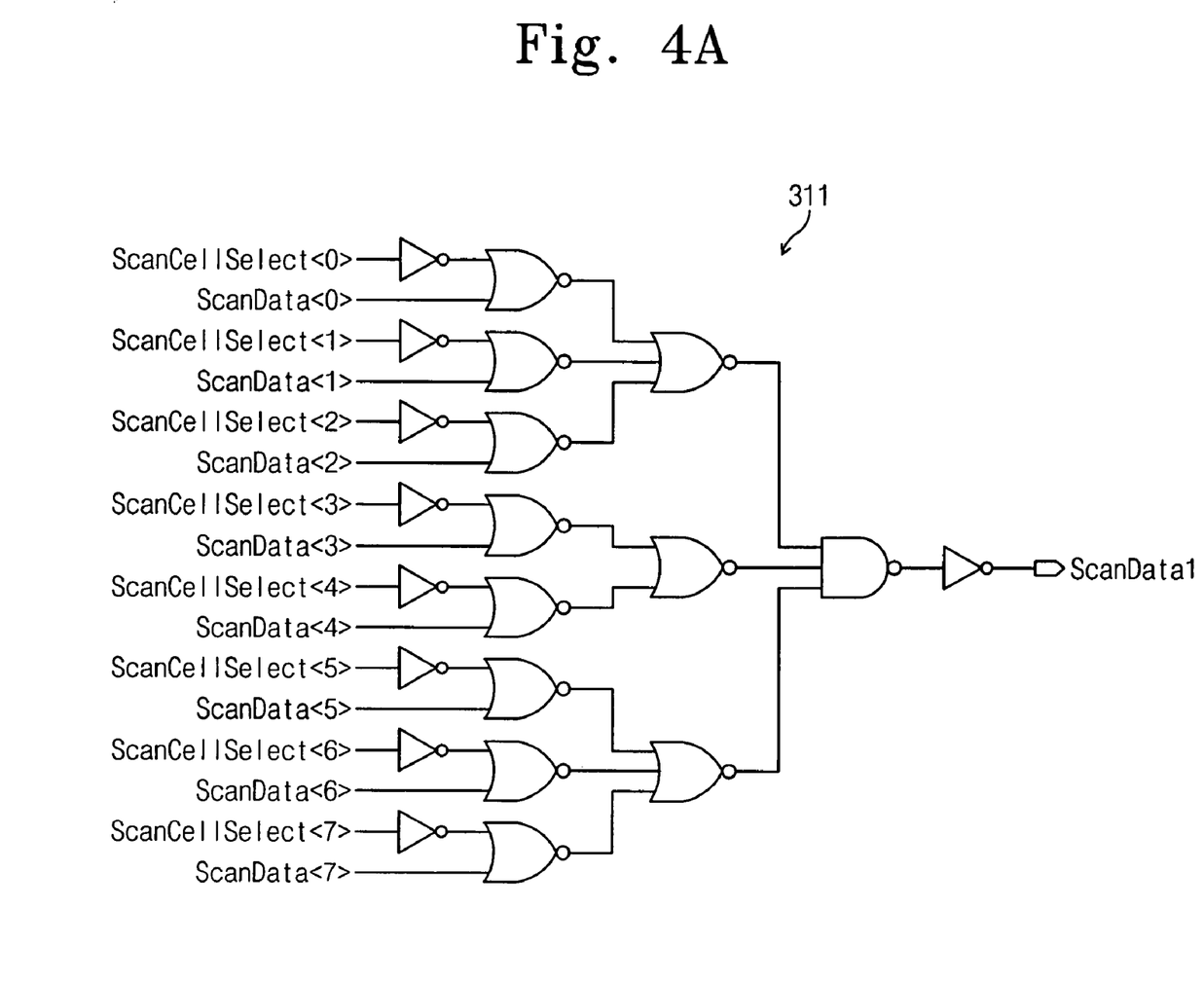
FIGS. 4A through 4D illustrate embodiments of signal combination circuits included in the scan data generator shown in FIG. 1.

Referring to FIG. 4A, the first signal combination circuit 311 alternately outputs each data bit ScanData<i> from the input/output buffer 20, in response to an external scan selection signal ScanCellSelect<i>. Data generated by the first signal combination circuit 311 is referred to as the first scanning data group signal ScanData1. The first scanning data group signal ScanData1 from the first signal combination circuit 311 is substantially identical to the data bit ScanData<i> supplied from the input/output buffer 20.

Figure 4B:
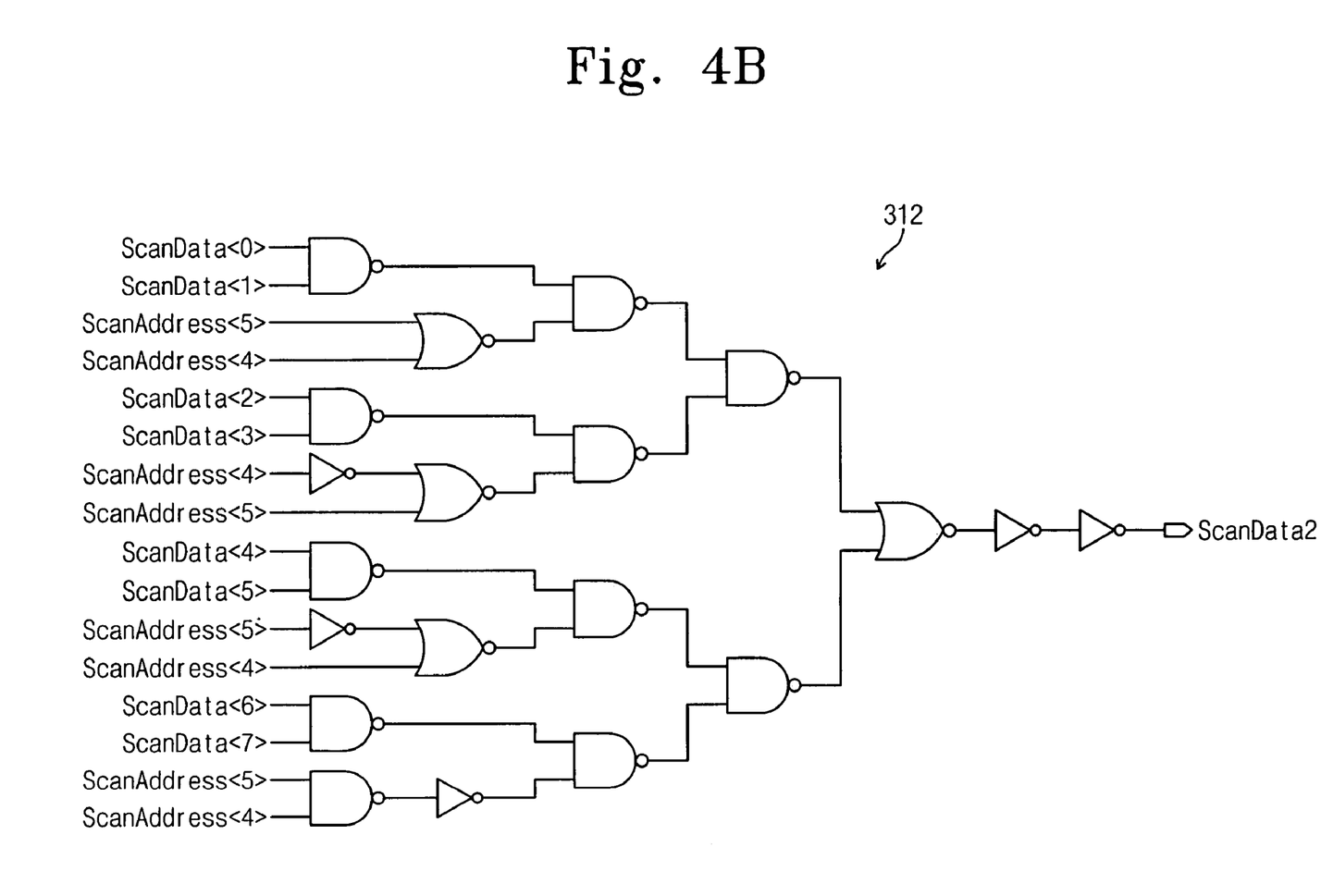

Referring to FIG. 4B, the second signal combination circuit 312 generates the second scanning data group signal ScanData2 by combining two adjacent bits (i.e., $2^1$ bits) of the input data ScanData<i> supplied from the input/output buffer 20. If a bit value of '0' is absent in the two bits containing the current scanning address, the second scanning data group signal ScanData2 is output as a '1'. If there is at least one '0' bit among the two adjacent bits, the second scanning data group signal ScanData2 is generated as a '0'. To accomplish this, the second combination circuit 312 logically combines the two bits with reference to scan addresses ScanAddress<4> and ScanAddress<5>. The value of the second scanning data group signal ScanData2 is identical to a product result for the adjacent two bits from the input data bits ScanData<i>.

Figure 4C:
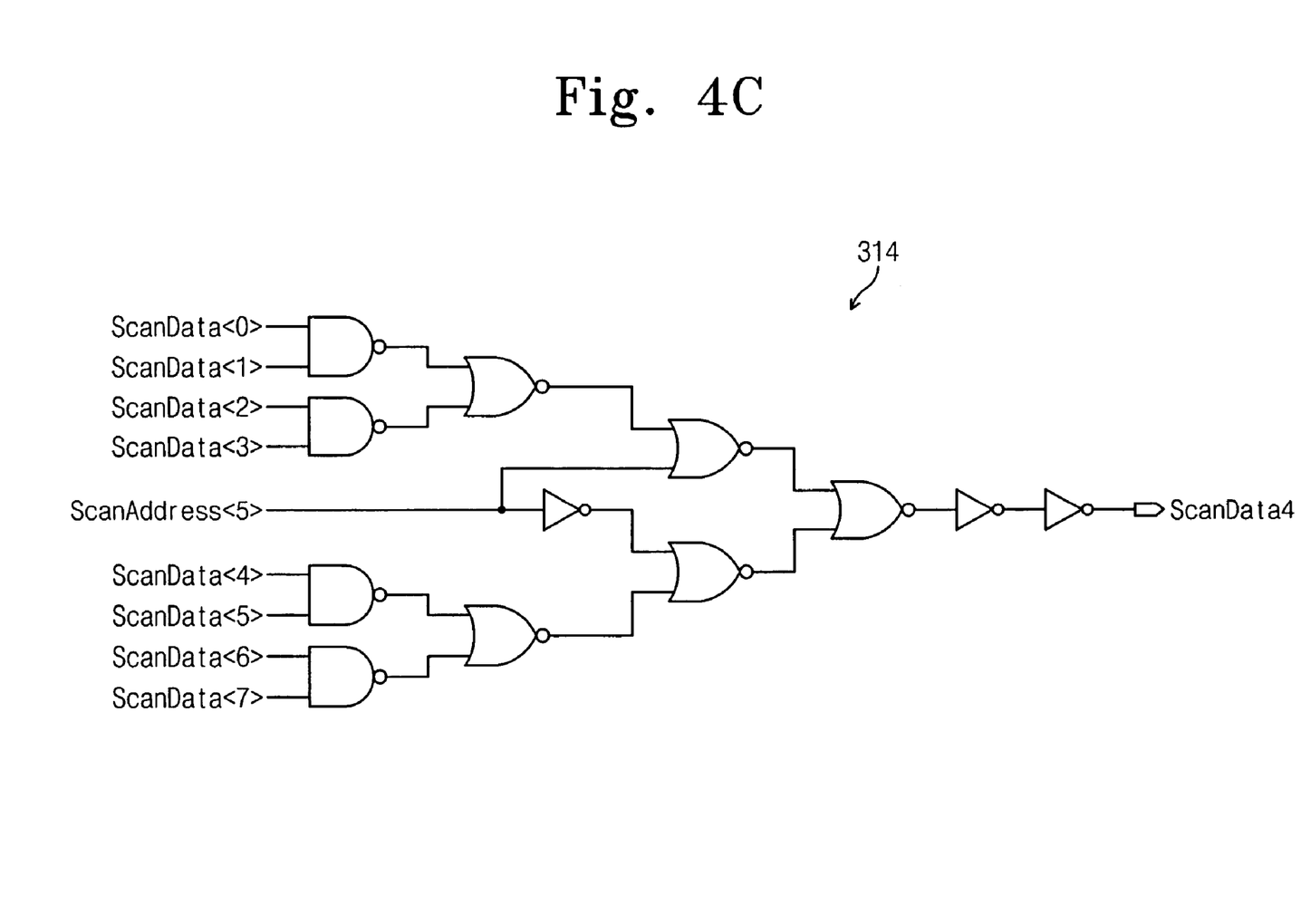

Referring to FIG. 4C, the third signal combination circuit 314 generates the third scanning data group signal ScanData4 by combining four adjacent bits (i.e., $2^2$ bits) from the data bits ScanData<i> supplied from the input/output buffer 20. If a bit value of '0' is absent in the four bits for the current scanning address, the third scanning data group signal ScanData4 is output as a '1'. If there is at least one '0' bit among the four adjacent bits, the third scanning data group signal ScanData4 is generated as a '0'. To accomplish the result, the third combination circuit 314 logically combines the four adjacent bits ($2^2$ bits) with reference to the scan address ScanAddress<5>. The value of the third scanning data group signal ScanData4 is identical to a product result for the four adjacent bits from the input data bits ScanData<i>.

Figure 4D:
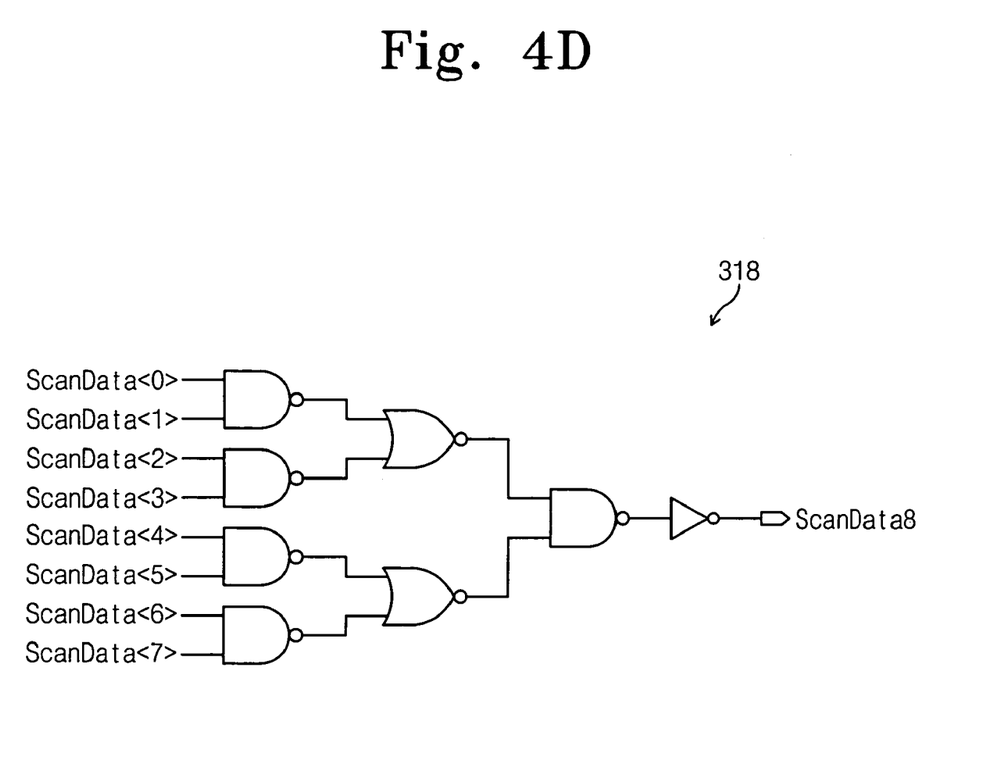

Referring to FIG. 4D, the fourth signal combination circuit 318 generates the fourth scanning data group signal ScanData8 by combining eight adjacent bits (i.e., $2^3$ bits) from the data bits ScanData<i> supplied from the input/output buffer 20. If a bit value of '0' is absent in the sequential eight bits for the current scanning address, the fourth scanning data group signal ScanData8 is output as a '1'. If there is at least one '0' bit value among the eight bits, the fourth scanning data group signal ScanData8 is generated as a '0'. The value of the fourth scanning data group signal ScanData8 is identical to the product result for the eight adjacent bits from the input data bits ScanData<i>.

As will be explained in more detail below, the first through fourth scanning data group signals ScanData1~ScanData8 generated by the first through fourth signal combination circuits 311~318 are used to count addresses and the number of data bits to be programmed. Specifically, the data bits that need to be programmed are identified by selective scanning operations in response values of the scanning data group signals ScanData1~ScabData8.

Figure 5:
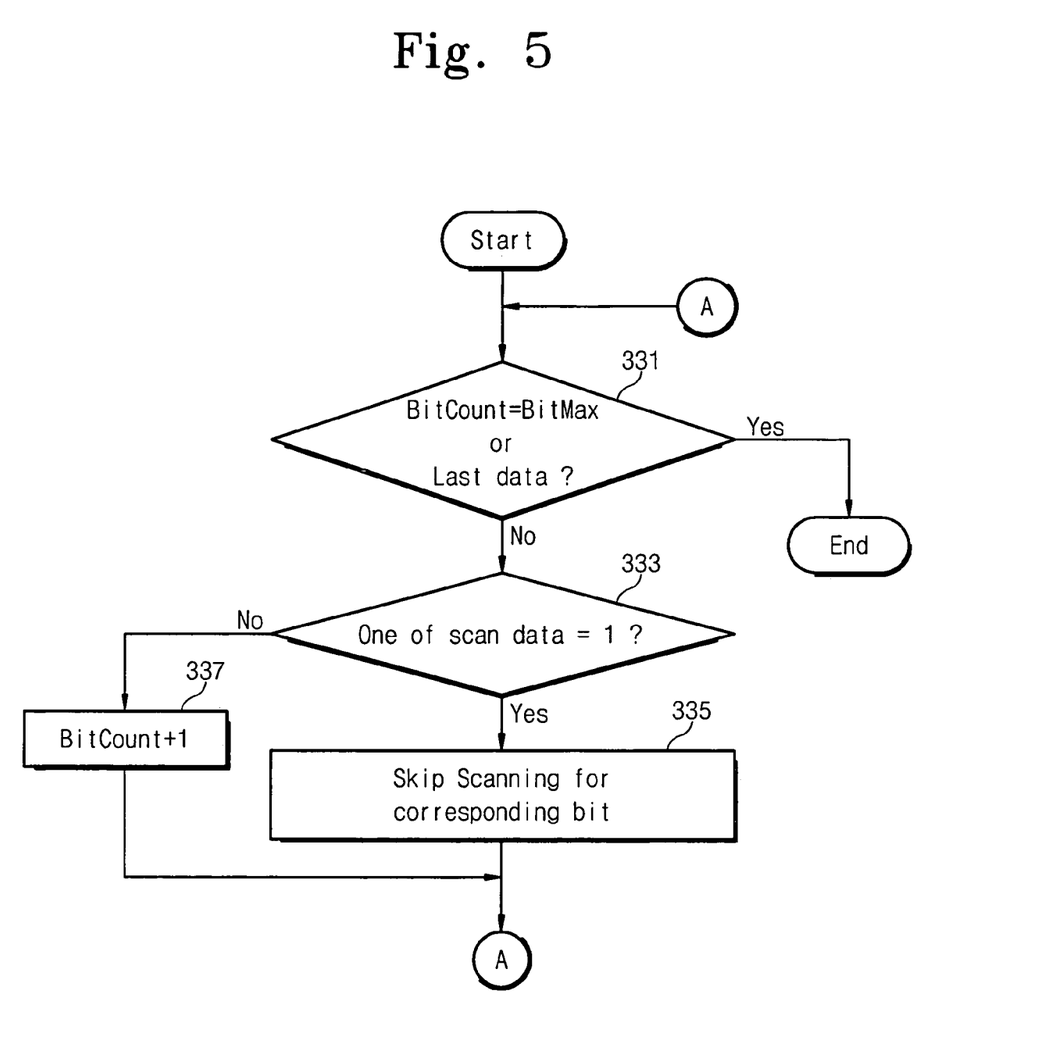
FIG. 5 is a flow chart showing an operation of the bit counter illustrated in FIG. 1.

FIG. 5 is a flow chart illustrating the operation of an embodiment of the bit counter 33 illustrated in FIG. 1. Referring to FIG. 5, the bit counter 33 determines whether the bit counting value BitCount (i.e., the number of bits to be programmed) has reached the simultaneously programmable bit number BitMax or whether a scanning operation for the last data bit has been performed (step 331). If BitCount is equal to BitMax, or the scanning operation for the last data bit has been completed, the counting operation is terminated. Otherwise, the bit counter 33 determines whether any of the scanning data group signals ScanData1~ScanData8 has a value of '1' corresponding to the current scanning position (step 333).

If there is no '1' among the scanning data group signals ScanData1~ScanData8 at the current scanning position, i.e., if all the scanning data group signals corresponding to the current scanning position are valued with '0', it determines the currently scanning bit as the data bit to be programmed and then increments the bit counting value BitCount by 1 (step 337). If there is a '1' among the scanning data group signals ScanData1~ScanData8 corresponding to the current scanning position, a scanning operation for the data bit of '1' corresponding thereto is omitted (step 335).

In this case, if the fourth scanning data group signal ScanData8 at the current scanning position is '1', none of the eight corresponding data bits will be programmed, and the eight data bits are not scanned. If the third scanning data group signal ScanData4 at the current scanning position is '1', the four corresponding data bits are not scanned. If the second data scanning group signal ScanData2 at the current scanning position is '1', the two corresponding data bits are not scanned. If the first scanning data group signal ScanData1 at the current scanning position is '1', none of the data bit corresponding thereto will be programmed, and the scanning operation moves to the next data bit.

The operation of the bit counter 33 repeats until the bit counting value BitCount reaches the simultaneously programmable bit number BitMax or the last data bit is scanned.

Figure 6:
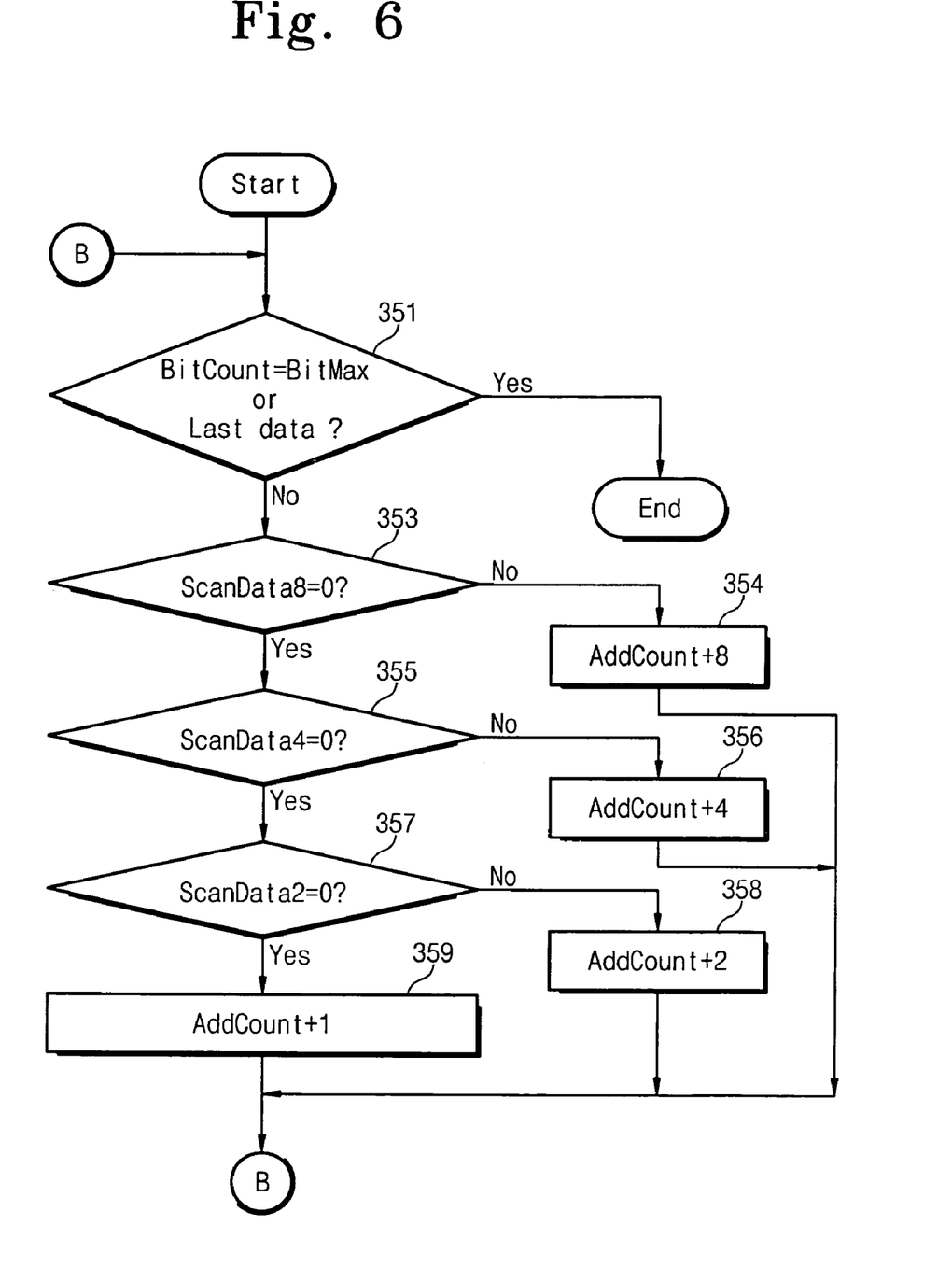
FIG. 6 is a flow chart showing an operation of the address counter illustrated in FIG. 1.
Figure 7:
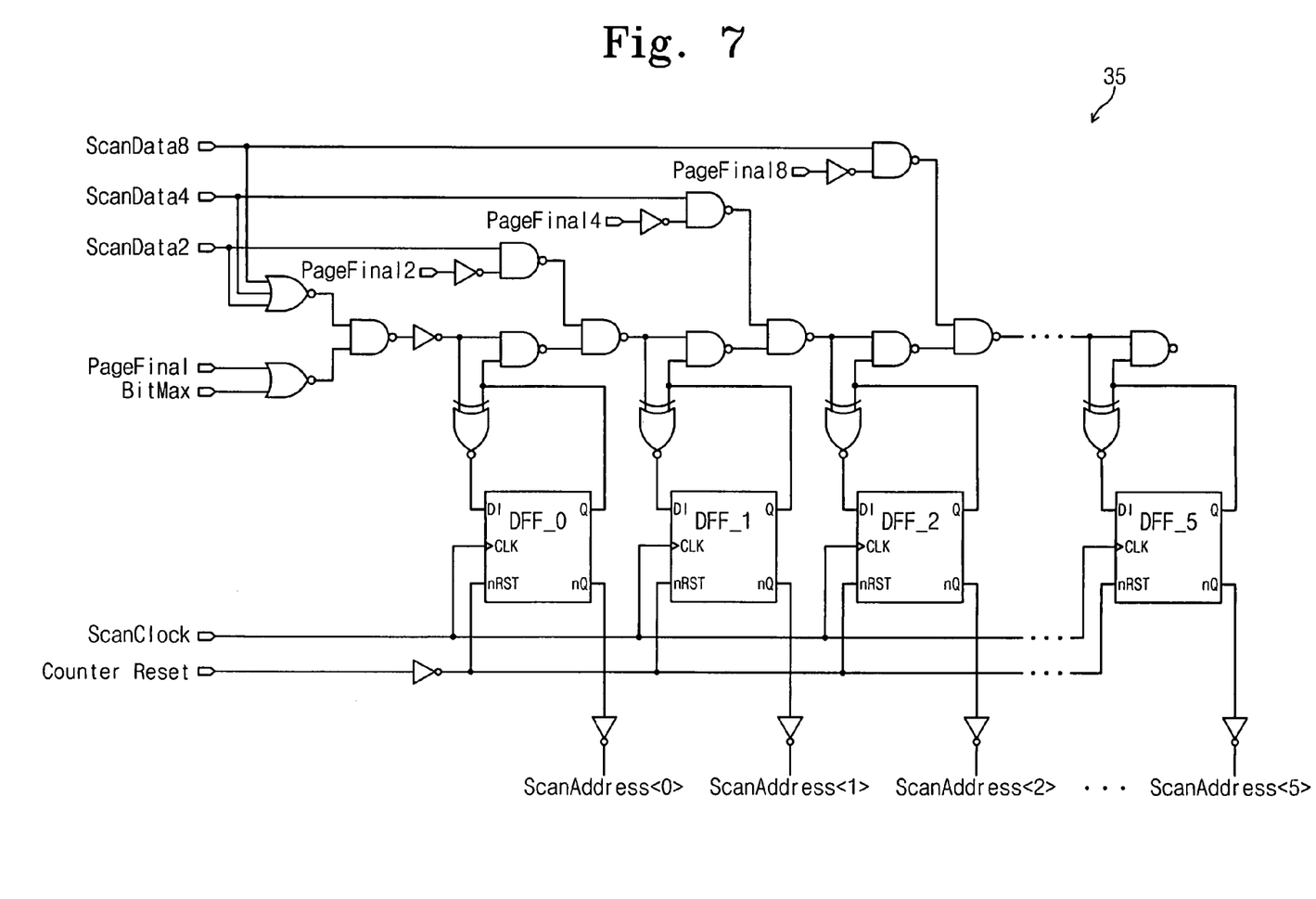
FIG. 7 is a circuit diagram illustrating an exemplary embodiment of the address counter shown in FIGS. 1 and 6.

FIGS. 6 and 7 illustrate the structure and operation of an example embodiment of the address counter 35 illustrated in FIG. 1. The address counter 35 of FIG. 7 includes six flip-flops DEF_0~DEF_5 and six data input units arranged to calculate a 6-bit address ScanAddress<5:0>. Each data input unit performs a logical operation on the scanning data group signals ScanData1~ScanData8, in response to BitMax, which indicates whether the maximum number of bits to be programmed have been detected, and signals PageFinal1~PageFinal8 which indicate whether the current page is the last page. The data input and output operations of the flip-flops corresponding thereto are controlled in response to the data input units. The flip-flops are reset by an external reset signal CounterReset and perform address counting operations in response to a scanning clock signal ScanClock. The scanning clock signal ScanClock is asserted when the scanning operation begins, as illustrated in FIG. 3, and deactivated while a programming operation is performed.

The operation of the address counter 35 in response to the scanning data group signals ScanData1~ScanData8 will be described with reference to FIGS. 6 and 7. The address counter 35 first determines whether the value of BitCount from the bit counter 33 has reached the maximum value BitMax, or whether the scanning operation for the last data bit has been performed (step 351). If BitCount equals BitMax or the last data bit has been scanned, the counting operation is terminated. Otherwise, the address counter 35 determines whether the fourth scanning data group signal ScanData8 corresponding to the current scanning position is '0' (step 353).

If the fourth scanning data group signal ScanData8 at the current scanning position does not contain any '0' bits (i.e., ScanData8 is all '1') and there has been no scanning operation for the last data bit, it determines that none of the eight adjacent data bits will be programmed. Thus, it increments an address counting value AddCount by 8 to skip the addresses of the eight data bits that will not be programmed (step 354). If the fourth scanning data group signal ScanData8 at the current scanning position contains a '0' at step 353, the address counter 35 determines whether the third scanning data group signal ScanData4 at the current scanning position contains a '0' (step 355).

If the third scanning data group signal ScanData4 at the current scanning position does not contain any '0' bits (i.e., ScanData4 is all '1') and the last data bit has not been scanned, it determines that none of the four data bits will be programmed. Thus, it increments AddCount by 4 in order to skip the addresses of the four data bits that not to be programmed (step 356). If the third scanning data group signal ScanData4 at the current scanning position contains a '0', the address counter 35 determines whether the second scanning data group signal ScanData2 at the current scanning position is a '0' (step 357).

If the second scanning data group signal ScanData2 at the current scanning position does not contain any '0' bits (i.e., ScanData2 is all '1') and the last data bit has not been scanned, it determines that none of the two data bits will be programmed. Thus, it increments AddCount by 2 to skip the addresses of the two data bits not to be programmed (step 358). If the second scanning data group signal ScanData2 at the current scanning position contains a '0', the address counter 35 determines whether the first scanning data group signal ScanData1 at the current scanning position is '0'. If so, it increments AddCount by 1 (step 359).

Thus, in an embodiment according to the inventive principles of this patent disclosure, addresses assigned to data bits that will actually be programmed may be calculated directly in response to the combinational signals ScanData1~ScanData8. This address generation technique may reduce the time needed to generate addresses because it selectively generates addresses of data bits to be programmed, rather than sequentially counting addresses.

An embodiment of a programming method according to the inventive principles of this patent disclosure as compared to a conventional method will be described in conjunction with FIGS. 8 through 10.

Figure 8:
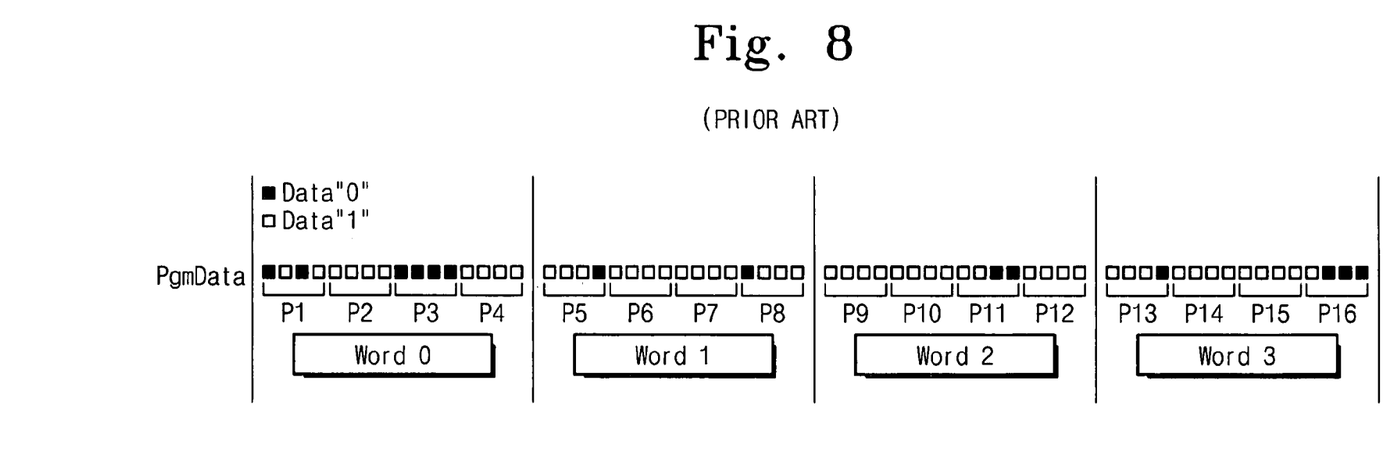
FIGS. 8 and 9 illustrate examples of conventional programming sequences.
Figure 9:
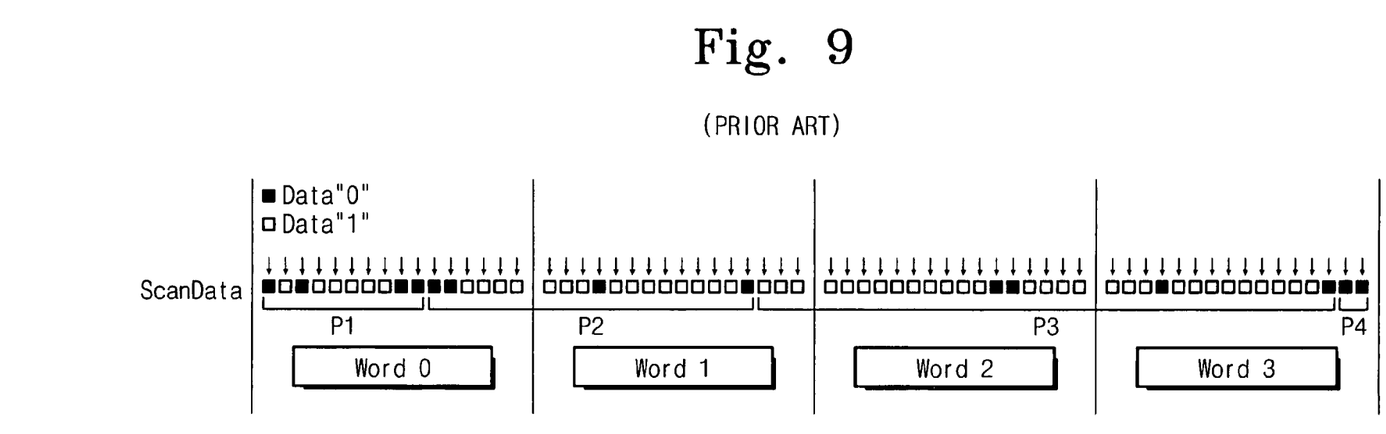

FIGS. 8 and 9 illustrate examples of conventional programming sequences. FIG. 8 shows a programming operation in which all bits in a predetermined unit are programmed regardless of the values of the bits to be programmed, while FIG. 9 shows an example of selective programming in which only '0' data bits are programmed, but all input data bits are scanned indiscriminately. In the program scheme shown in FIG. 8, a uniform program time is allocated for each data group without regard to the values of the data bits. In this case, if the maximum number of bits to be programmed simultaneously is 4, 16 program times are required to program 4 words (64 bits) of data.

In the programming scheme of FIG. 9, selective programming of only the '0' data bits reduces the programming time to 4 programming cycles. However, the programming scheme of FIG. 9 can only perform programming process after completing sequential data scanning operations for all data bits (identified by the arrows in FIG. 9), thereby spending unnecessary time scanning all data bits.

Figure 10:
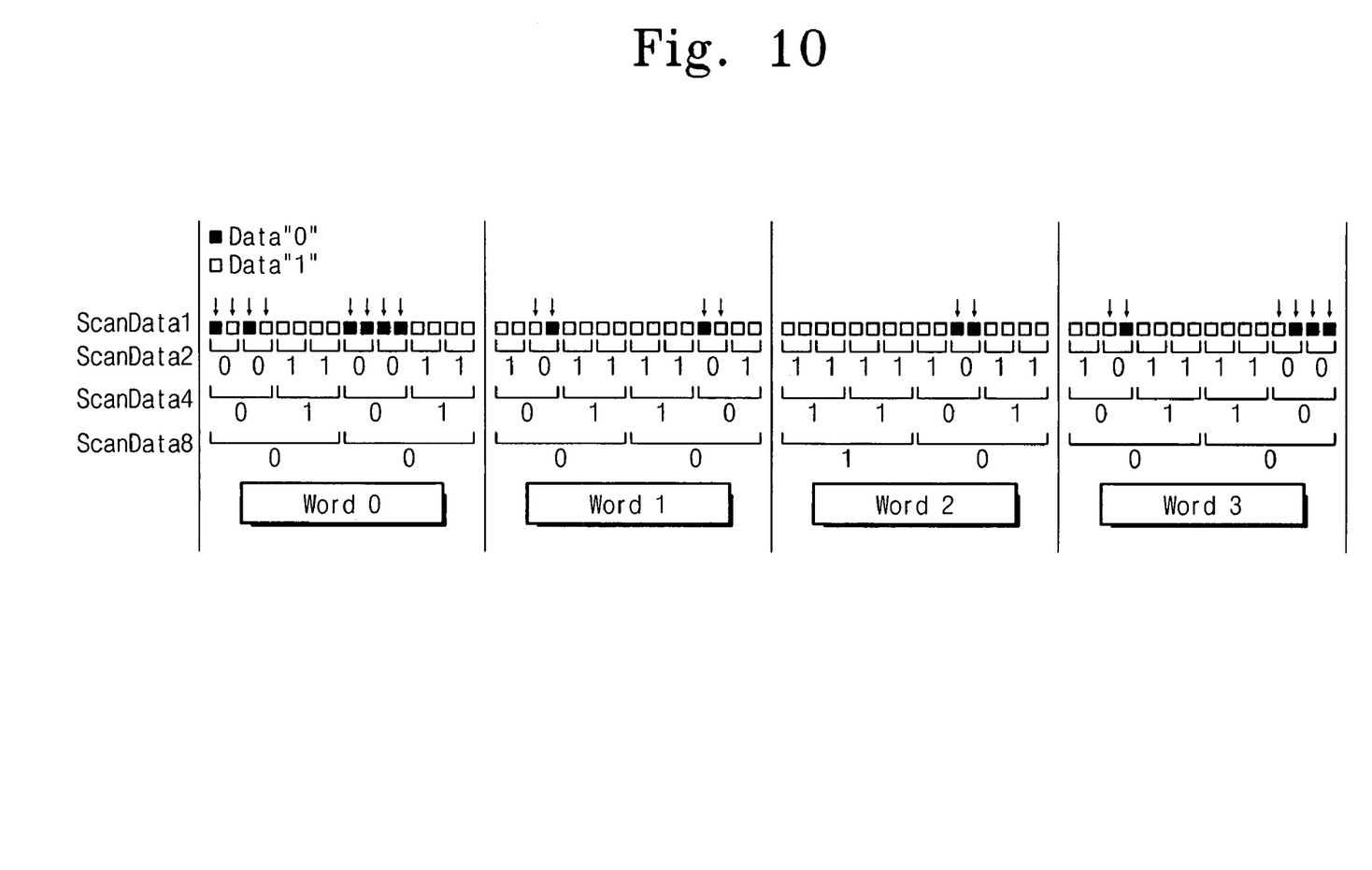
FIG. 10 illustrates an example embodiment of a programming sequence according to the inventive principles of this patent disclosure.

FIG. 10 illustrates the operation of an example embodiment of a programming sequence according to the inventive principles of this patent disclosure. Referring to FIG. 10, a data scanning operation is selectively conducted in response to the values of the data combination results, ScanData1, ScanData2, ScanData4, and ScanData8 for data bits indicated by the arrows in FIG. 10 for which addresses are generated.

For example, if the value of the fourth scanning data group signal ScanData8, which corresponds to the bit position currently being scanned, is '1', it skips the data scanning operation for the current 8 bits and increments the address value by 8. If the value of the third scanning data group signal ScanData4, which corresponds to the bit position currently being scanned, is '1', it skips the data scanning operation for the current 4 bits and increments the address value by 4. If the value of the second scanning data group signal ScanData2, which corresponds to the bit position currently being scanned, is '1', it skips the data scanning operation for the current 2 bits and increments the address value by 2. With such selective data scanning and address generating operations, the scanning time may be reduced remarkably as the scanning operation is selectively performed only for that data indicated by the arrows in FIG. 10.

As described above, embodiments of programming methods for nonvolatile memory devices according to the inventive principles of this patent disclosure may combine multiple input data bits into scanning data group signals, and selectively scan the data bits with reference to the result of the combinational operations. As a result, cycle times for scanning operations to detect data bits to be actually programmed may be reduces. And, since addresses may be conducted selectively only for detected bits, it may be possible to effectively reduce the address generation time, which in turn may reduce the entire time for programming data.

Although the inventive principles of this patent disclosure have been described in connection with some example embodiments, the inventive principles are not limited thereto. It will be apparent to those skilled in the art that various substitution, modifications and changes may be thereto without departing from the inventive principles.

The invention claimed is:

1. A method of programming a nonvolatile memory device comprising:
   selectively scanning input data bits to detect data bits to be programmed; and
   programming the detected data bits;
   wherein selectively scanning input data bits comprises combining input data bits in groups, thereby generating combinational information, and generating address information in response to the combinational information; and
   wherein the address information is used to control which data bits are programmed.

2. The method as set forth in claim 1, wherein the detected data bits are programmed in predetermined units.

3. The method as set forth in claim 1, wherein generating address information comprises operating a counter in response to the combinational information.

4. The method as set forth in claim 1, wherein combining input data bits in groups comprises combining a plurality of input data bits.

5. The method as set forth in claim 1, wherein combining input data bits in groups comprises combining input data bits with a scan address.

6. The method as set forth in claim 1, wherein combining input data bits in groups comprises combining input data bits with multiple scan addresses.

7. The method as set forth in claim 1, wherein combining input data bits in groups comprises combining input data bits with one or more scan cell select signals.

8. The method as set forth in claim 1, wherein $2^N$ bits are combined to form M groups, where M and N are positive integers.

9. The method as set forth in claim 1, wherein programming the detected data bits comprises selectively programming the detected data bits according to the address information.

10. The method as set forth in claim 2, wherein the predetermined unit corresponds to a programmable maximum number of bits.

11. The method as set forth in claim 8, wherein, when the M groups all have a first value, the number of the data bits to be programmed is counted.

12. The method as set forth in claim 8, wherein, when at least one of the M groups has a second value, a data scanning operation for the group having the second value is skipped.

13. A nonvolatile memory device comprising:
   a data scanning unit to selectively scan input data bits, thereby identifying detected data bits to be programmed; and
   a write driver to program the detected data bits;
   wherein the data scanning unit comprises:
      combinational logic to generate combinational signals by combining input data bits; and
      an address generator to generate addresses in response to the combinational signals; and
   wherein the addresses are used to control which data bits are programmed.

14. The nonvolatile memory device as set forth in claim 13, wherein the data scanning unit further comprises logic to count detected data bits.

15. The nonvolatile memory device as set forth in claim 13, wherein the combinational logic comprises logic trees to generate the combinational signals in response to input data bits, scan addresses, and/or scan cell select signals.

16. The nonvolatile memory device as set forth in claim 13, wherein the address generator comprises a string of flip-flops to generate the addresses in response to the combinational signals and a scan clock signal.

17. The nonvolatile memory device as set forth in claim 14, wherein the logic to count detected data bits is constructed to count detected data bits to a programmable maximum number.

18. A nonvolatile memory device comprising:
   means for selectively scanning input data bits; and
   means for programming selectively scanned input data bits;
   wherein the means for selectively scanning input data bits comprises:
      means for combining input data bits; and
      means for generating addresses for selectively scanned input data bits; and
   wherein the addresses are used to control which data bits are programmed.

19. The nonvolatile memory device of claim 18, wherein the means for selectively scanning input data bits further comprises means for counting a maximum number of data bits to be programmed.

20. The nonvolatile memory device of claim 18, wherein the means for generating addresses comprises means for calculating an address if a group of data bits includes a data bit to be programmed, and skipping calculating an address if a group of data bits does not include a data bit to be programmed.

21. The nonvolatile memory device of claim 18, wherein the means for combining input data bits comprises means for combining input data bits with one or more scan addresses.

22. The nonvolatile memory device of claim 18, wherein the means for combining input data bits comprises means for combining input data bits with one or more scan addresses and/or scan cell select signals.

23. A method of programming a nonvolatile memory device comprising:
   combining data bits that are input to the memory device into plural groups;
   selectively scanning the data bits in accordance with results of the combination, and detecting data bits to be programmed; and
   programming the detected data bits in units of predetermined bit numbers;

wherein the results of the combination are used to control which data bits are programmed.

24. A nonvolatile memory device comprising:
a data scanning unit to detect data bits which are to be actually programmed by selectively scanning data bits that are input to the memory device; and
a write driver to program the detected data bits in units of predetermined bit numbers;
wherein the data scanning unit comprises:
a scan data generator to output plural scanning data groups combined from the input data bits, and
a bit counter to selectively scan the data bits according to the scanning data groups and detect data bits to be programmed.

* * * * *